United States Patent
Kawagoe et al.

(10) Patent No.: US 6,917,550 B2
(45) Date of Patent: Jul. 12, 2005

(54) SEMICONDUCTOR MEMORY DEVICE

(75) Inventors: Masakuni Kawagoe, Miyazaki (JP); Akihiro Narumi, Miyazaki (JP)

(73) Assignee: Oki Electric Industry Co., Ltd., Tokyo (JP)

(*) Notice: Subject to any disclaimer, the term of this patent is extended or adjusted under 35 U.S.C. 154(b) by 0 days.

(21) Appl. No.: 10/403,053

(22) Filed: Apr. 1, 2003

(65) Prior Publication Data

US 2004/0196716 A1 Oct. 7, 2004

(51) Int. Cl.[7] ............................................... G11C 7/00
(52) U.S. Cl. ...................................................... 365/205
(58) Field of Search ................................ 438/205, 202, 438/340; 365/210, 207, 205, 200, 189.05; 327/544

(56) References Cited

U.S. PATENT DOCUMENTS 5,608,674 A * 3/1997 Yabe et al. ............ 365/189.05

6,256,246 B1 * 7/2001 Ooishi ........................ 365/205

FOREIGN PATENT DOCUMENTS

JP 05-036277 2/1993
JP 2000-298984 10/2000

* cited by examiner

*Primary Examiner*—Craig A. Thompson
*Assistant Examiner*—Monica D. Harrison
(74) *Attorney, Agent, or Firm*—Volentine Francos & Whitt, PLLC

(57) ABSTRACT

A semiconductor memory device includes a pair of bit lines; a first sense amplifier coupled to the pair of bit lines; and a first controller, which controls the first sense amplifier. The first sense amplifier includes a flip-flop circuit having a pair of NMOS transistors and a pair of PMOS transistors; a first transistor connected to a source terminal of the NMOS transistors in the flip-flop circuit; and a second transistor connected to a source terminal of the PMOS transistors in the flip-flop circuit. The first controller includes a first NOR circuit, having input terminals to which a write command signal and a sense amplifier driving signal are supplied and having an output terminal connected to a gate of the first transistor.

15 Claims, 8 Drawing Sheets

SEMICONDUCTOR MEMORY DEVICE

TECHNICAL FIELD OF THE INVENTION

The present invention relates to a semiconductor memory device in which writing operation is improved.

BACKGROUND OF THE INVENTION

In recent years, semiconductor integrated circuits have been becoming smaller in size. For that reason, wiring load, including wiring resistance and wiring capacity, is increased in amount. Now, it is required to minimize a delay of data transmission and improve operation speed of a sense amplifier.

OBJECTS OF THE INVENTION

Accordingly, it is an object of the present invention to provide a semiconductor memory device in which operation speed is improved.

Additional objects, advantages and novel features of the present invention will be set forth in part in the description that follows, and in part will become apparent to those skilled in the art upon examination of the following or may be learned by practice of the invention. The objects and advantages of the invention may be realized and attained by means of the instrumentalities and combinations particularly pointed out in the appended claims.

SUMMARY OF THE INVENTION

According to a first aspect of the present invention, a semiconductor memory device includes: a pair of bit lines; a first sense amplifier coupled to the pair of bit lines; and a first controller, which controls the first sense amplifier. The first sense amplifier comprises a flip-flop circuit having a pair of NMOS transistors and a pair of PMOS transistors; a first transistor connected to a source terminal of the NMOS transistors in the flip-flop circuit; and a second transistor connected to a source terminal of the PMOS transistors in the flip-flop circuit. The first controller comprises a first NOR circuit, comprising input terminals to which a write command signal and a sense amplifier driving signal are supplied and an output terminal connected to a gate of the first transistor.

According to a second aspect of the present invention, a semiconductor memory device includes a memory cell array; a pair of bit lines, coupled to the memory cell array; a sense amplifier which is coupled to the pair of bit lines; switching transistors which are connected between the bit lines and the memory cell array; and a transmission control circuit, which supplies a transmission signal to the switching transistors to turn them off in writing operation.

According to a third aspect of the present invention, a semiconductor memory device includes a memory cell array; a pair of bit lines, coupled to the memory cell array; a sense amplifier which is coupled to the pair of bit lines; a pair of data lines; a switching transistor coupled between the data line and the bit line; a data driver which supplies data to the data lines; and a latch circuit coupled to the data lines.

DETAILED DISCLOSURE OF THE INVENTION

In the following detailed description of the preferred embodiments, reference is made to the accompanying drawings which form a part hereof, and in which is shown by way of illustration specific preferred embodiments in which the inventions may be practiced. These preferred embodiments are described in sufficient detail to enable those skilled in the art to practice the invention, and it is to be understood that other preferred embodiments may be utilized and that logical, mechanical and electrical changes may be made without departing from the spirit and scope of the present inventions. The following detailed description is, therefore, not to be taken in a limiting sense, and scope of the present inventions is defined only by the appended claims.

For better understanding of the present invention, a background technology is first described.

Figure 1:
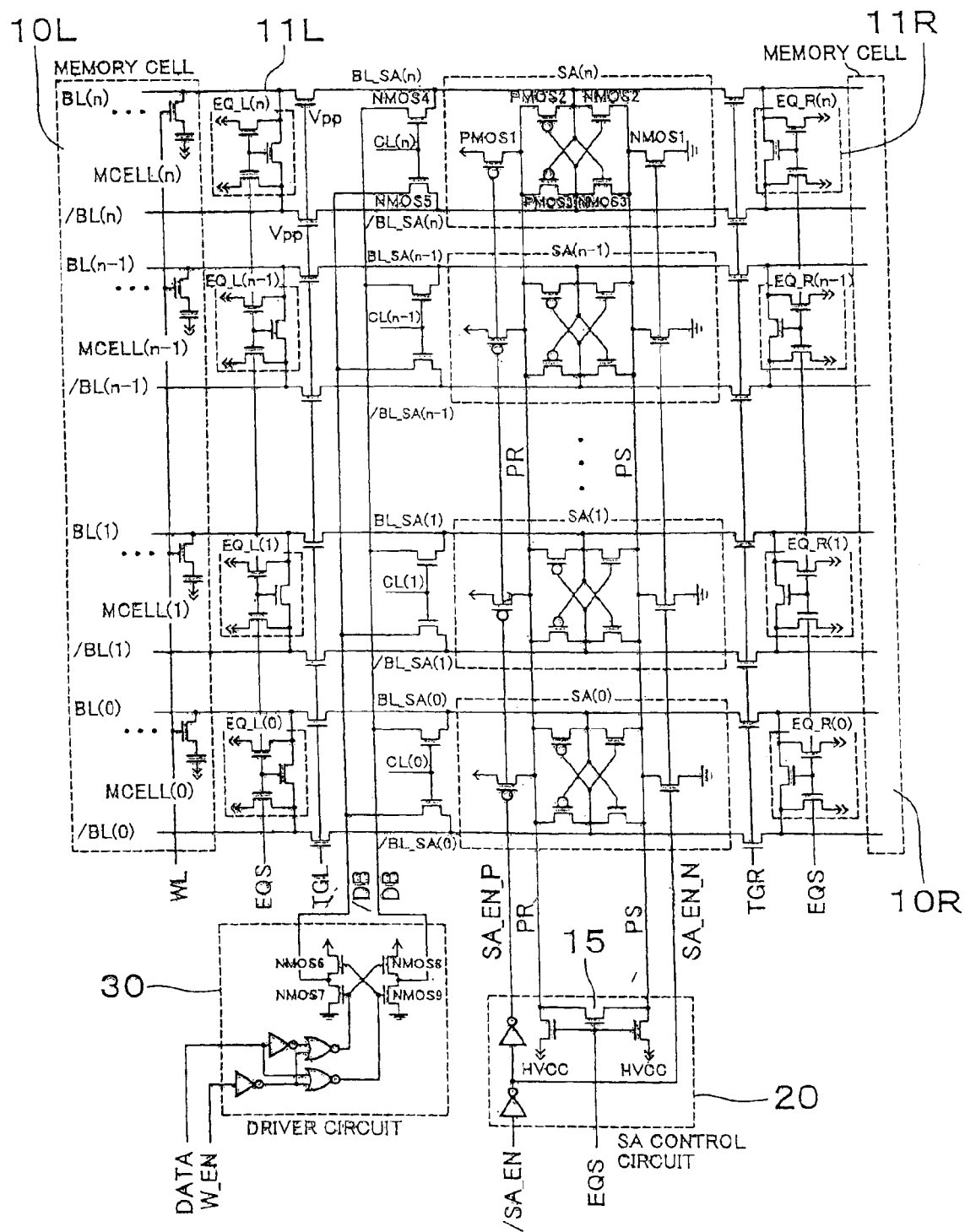
FIG. 1 is a circuit diagram showing a conventional semiconductor memory.
Figure 2:
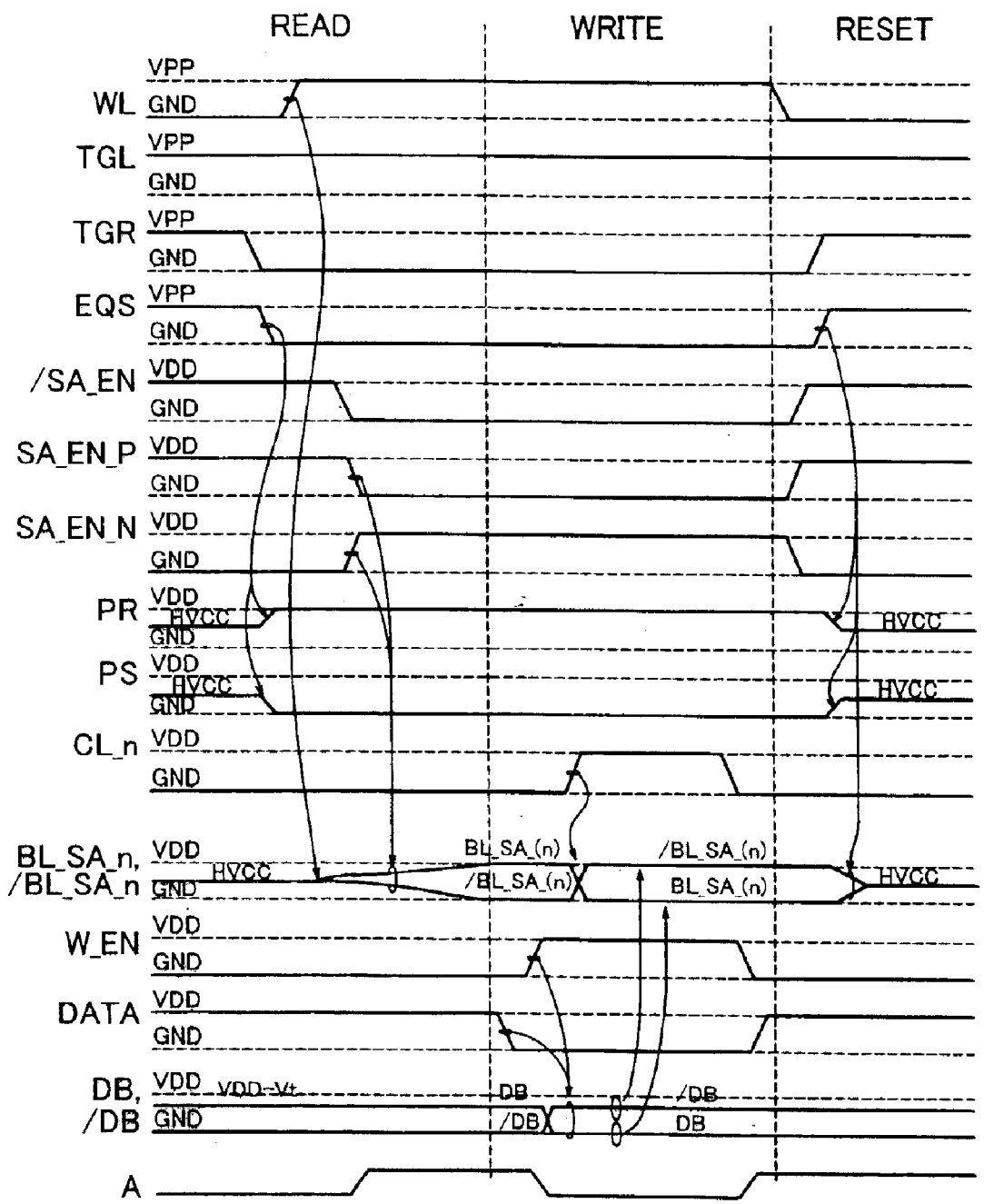
FIG. 2 is a timing chart showing operation of the conventional semiconductor memory, shown in FIG. 1.

FIG. 1 is a circuit diagram illustrating a conventional semiconductor memory device. FIG. 2 is a time chart showing the operation of the circuit, shown in FIG. 1. The semiconductor memory device includes memory cell regions 10L and 10R; a sense amplifier SA(n); equalizer circuits 11L and 11R for bit lines; a sense amplifier control circuit (SA control circuit) 20; and a write driver circuit 30.

The sense amplifier SA(n) includes a flip-flop circuit and a pair of MOS transistors. The flip-flop circuit includes four transistors PMOS2, PMOS3, NMOS2 and NMOS3. Sources of the PMOS2 and PMOS3 are connected to each other at a node PR. Sources of the NMOS2 and NMOS3 are connected to each other at a node PS. A PMOS1 is connected between the node PR and a power supply VDD. A NMOS1 is connected between the node PS and a ground terminal GND. The nodes PR and PS are connected to an equalizer 15 in the SA control circuit 20. In order to increase an equalizing speed of a pair of bit lines BL_SA and /BL_SA, the nodes PR and PS are connected to corresponding nodes of the other sense amplifiers SA(0) to SA(n−1).

In reading operation, when a transmitting signal TGR is turned to low "L", the memory cell region 10L is selected for use. The selected memory cell region 10L is connected to the sense amplifier SA(n) by a pair of bit lines BL_SA(BL_SA,/BL_SA). Almost at the same time, an equalizing signal EQS, which equalize a pair of bit lines, is turned to low "L", so that an equalizing process to the bit lines is cancelled. In other words, all NMOSs included in equalizing circuits 11L (EQ_L(0) to EQ_L(n)) and 11R (EQ_R(0) to EQ_R(n)) are turned off.

After that, a word line WL is turned to high "H" in level, the memory cell region 10L is selected for use. Data stored in memory cells MCELL(0) to MCELL(n) in the memory cell region 10L are read out. In accordance with the read data, a fine potential difference is generated between a pair of bit line BL(0) to BL(n) and /BL(0) to BL(n). At the same time, in each sense amplifier SA(n), a fine potential difference is generated between a pair of BL__SA(0) to BLSA(n) and /BL__SA(0) to /BL__SA(n).

Next, a sense amplifier driving signal "/SA__EN," to be supplied to the sense amplifier control circuit 20, is turned to low "L" in level. As a result, a signal "SA__EN__P" and a signal "SA__EN__N," which are generated from a signal "/SA__EN," are turned to low "L" and high "H", respectively. The sense amplifier circuit SA(n) is supplied with the supply voltage VDD and ground voltage GND. For example, the PMOS1 and NMOS1 in the sense amplifier circuit SA(n) are turned on. As a result, the sense amplifier circuit SA(n) is activated, and the data supplied to a pair of bit lines BL__SA and /BL__SA are amplified.

Subsequently, the operation for writing data, which are opposite to existing data, will be described. When write data are inputted from an external circuit, the write data are supplied to a data terminal DATA in a write driver circuit 30. In this embodiment, since data "0" are to be written, the data signal "DATA" is low "L" in level. When a write command is inputted, a signal "W__EN" is turned to high "H" in level. Therefore, in the write driver circuit 30, NMOS6 and NMOS9 are turned on, and NMOS7 and NMOS8 are turned off. As a result, a data line DB is turned to low "L" in level, and a data line /DB is supplied with a data signal "VDD-Vt". A selected column line CL(n) is turned to high "H" in level, so that NMOS4 and NMOS5, in which gates are connected to the selected column line, are turned on.

Next, the data line DB is connected with the bit line BL__SA(n), while the data line /DB is connected with the bit line /BL__SA(n), so that data are transferred to a pair of bit lines. At this time, the bit line BL__SA(n) is turned from high "H" to low "L", while the bit line /BL__SA(n) is turned from low "L" to "VDD-Vt". As a result, the amplified data are written into the memory cell.

After that, the column line CL is turned to "L". The NMOS4, which connects the bit line BL__SA and the data line DB, and the NMOS5, which connects the bit line /BL__SA and the data line /DB, are turned off.

In order to perform a reset operation, the word line WL is turned to low "L" in level. The memory cell MCELL is disconnected with the bit line BL. Data are stored in the memory cell MCELL. After that, the sense-amplifier-driving signal /SA__EN is turned to high "H". Another sense-amplifier-driving signal SA__EN__P is turned to high "H" in level, and a sense-amplifier-driving signal SA__EN__N is turned to low "L". As a result, the sense amplifier circuit SA is inactivated. After that, an equalizing signal EQS is turned to high "H" in level, so that nodes PR and PS in the sense amplifier circuit SA and the bit lines BL and /BL are equalized to HVCC. Next, first to sixth preferred embodiments of the present invention will be described. These embodiments are based on the above-described background technology, shown in FIG. 1.

First Preferred Embodiment

Figure 3:
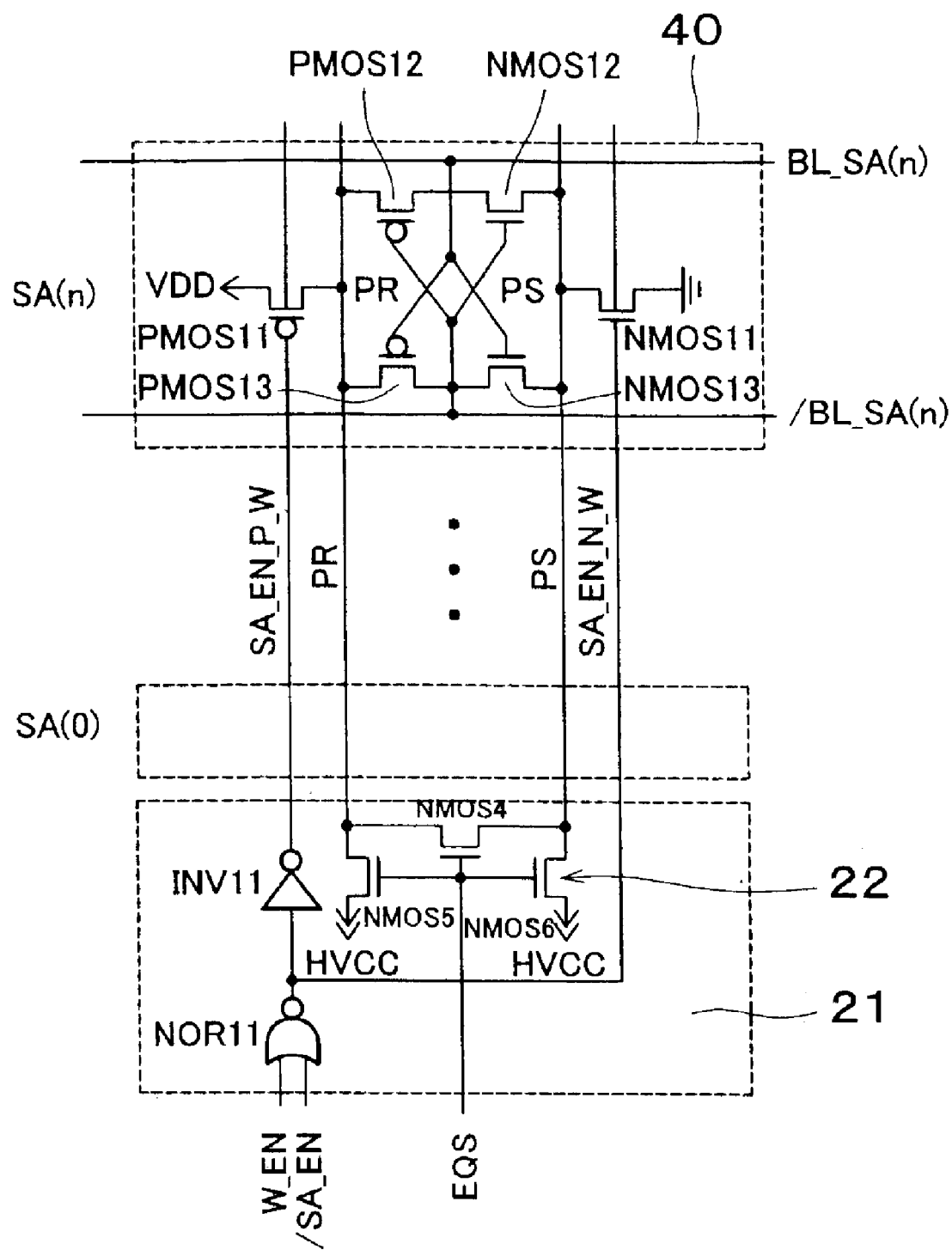
FIG. 3 is a circuit diagram illustrating a semiconductor memory device according to a first preferred embodiment of the present invention.

FIG. 3 is a circuit diagram showing a part of a semiconductor memory device according to a first preferred embodiment of the present invention. The semiconductor memory device includes a first sense amplifier 40 and a first controller 21, functioning as a sense amplifier controller.

The first sense amplifier 40 includes a flip-flop circuit and a pair of MOS transistors. The flip-flop circuit includes four transistors PMOS12, PMOS13, NMOS12 and NMOS13. Sources of the PMOS12 and PMOS13 are connected to each other at a node PR. Sources of the NMOS12 and NMOS13 are connected to each other at a node PS. A PMOS11 is connected between the node PR and a power supply VDD. A NMOS11 is connected between the node PS and a ground terminal GND.

The nodes PR and PS are connected to an equalizer 22 in the first control circuit 21. The first sense amplifier 40 is connected to a pair of bit lines BL__SA(n) and /BL__SA(n).

The first controller 21 includes the above described equalizer 22, a first NOR circuit "NOR11" and an inverter circuit INV11, which inverts an output of the NOR11. The first NOR circuit NOR11 is supplied with an external write command signal W__EN and a sense amplifier driving signal /SA__EN. An output terminal of the first NOR circuit NOR11 is connected to a gate of a first transistor NMOS11 and an input terminal of the first inverter INV11. An output terminal of the first inverter INV11 is connected to a gate of a second transistor PMOS11. In the sense amplifier control circuit 21, when the write command signal W__EN and sense amplifier driving signal /SA__EN are entered, sense amplifier driving signals SA__EN__N__W and SA__EN__P__W are outputted.

The operation in response to an equalizing signal EQS is the same as the conventional circuit shown in FIG. 1. Reading operation according to the first preferred embodiment is also the same as the conventional circuit shown in FIG. 1.

In writing operation, the sense amplifier driving signal /SA__EN and equalizing signal EQS are maintained at a low level "L". The write command signal W__EN is turned from low "L" to high "H". At this time, a signal SA__EN__N__W is turned from high "H" to low "L", while a signal SA__EN__P__W is turned from low "L" to high "H". As a result, the sense amplifier is disabled.

When the writing operation is ending, a signal W__EN is turned from high "H" to low "L". At this time, the signals SA__EN__N__W and SA__EN__P__W are turned to high "H" and low "L", respectively. As a result, the sense amplifier 40 is enabled.

According to the first preferred embodiment, only during a writing operation, the sense amplifier 40 is disabled, so that electrical current flowing through the sense amplifier 40 is shut off during the writing operation. Especially, such a function is useful when reverse data are to be written. As a result, the nodes PS and PR, connected to a pair of bit lines BL__SA and /BL__SA, can be reversed at a high speed.

Second Preferred Embodiment

Figure 4:
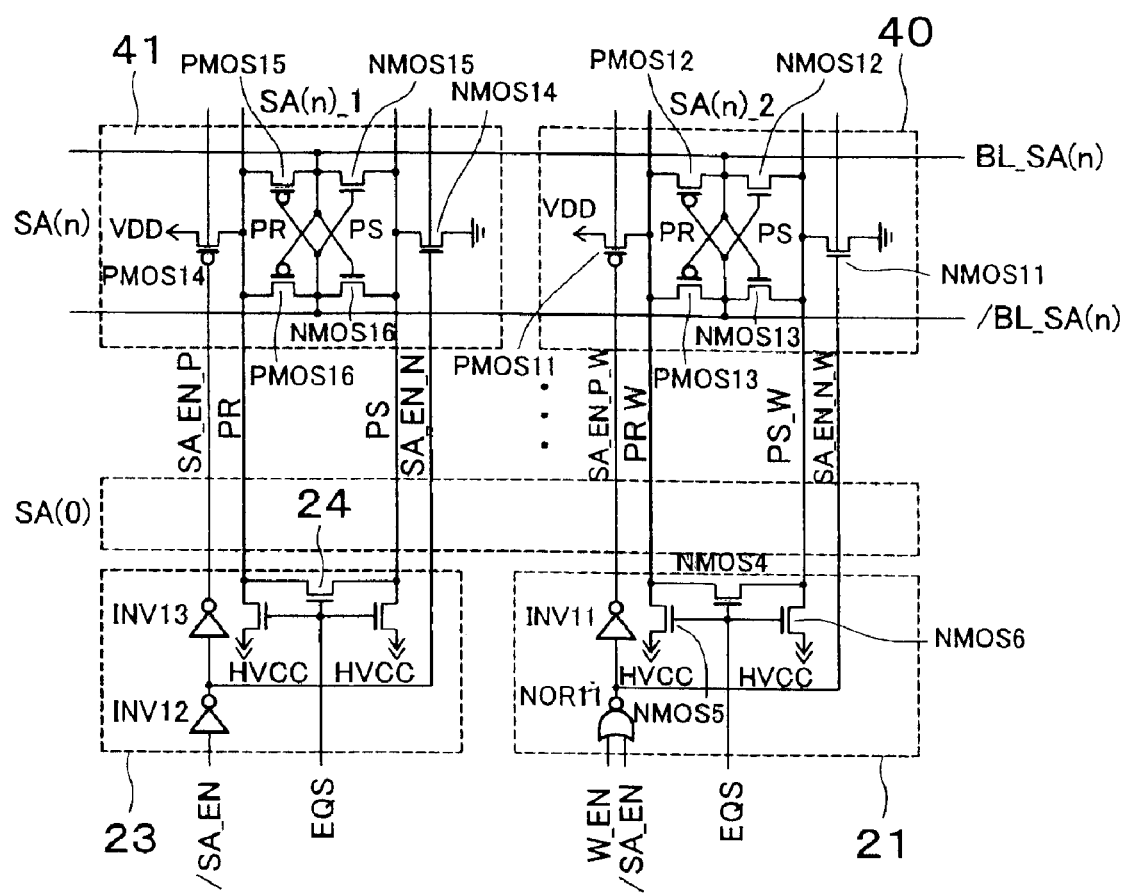
FIG. 4 is a circuit diagram illustrating a semiconductor memory device according to a second preferred embodiment of the present invention.

FIG. 4 is a circuit diagram showing a part of a semiconductor memory device according to a second preferred embodiment of the present invention. In this embodiment, the same structures and functions as those in the first preferred embodiment, shown in FIG. 3, is not described again.

According to the second preferred embodiment, a pair of a sense amplifier 40 and a controller 21 of the first preferred embodiment, shown in FIG. 3, is combined with a pair of a sense amplifier SA(n) and a controller 20 of the conventional circuit, shown in FIG. 1. In more detail, the semiconductor memory device according to the second preferred embodiment includes a first sense amplifier 40 (SA(n)__2) connected between a pair of bit lines BL__SA(n) and /BL__SA(n); a first controller 21; a second sense amplifier 41 (SA(n)__1), connected to the same bit lines BL__SA(n) and /BL_SA(n) as the first sense amplifier 40; and a second sense amplifier controller 23.

The second sense amplifier 41 includes a flip 4 lop circuit, a third transistor NMOS14 and a fourth transistor PMOS14. The flip-flop circuit includes four transistors PMOS15, PMOS16, NMOS15 and NMOS16. Sources of the PMOS15 and PMOS16 are connected to each other at a node PR. Sources of the NMOS15 and NMOS16 are connected to each other at a node PS. The third transistor NMOS14 is connected between the node PS and a ground terminal GND. The fourth transistor PMOS14 is connected between the node PR and a power supply VDD.

The nodes PR and PS are connected to an equalizer 24 in the second control circuit 23. The second sense amplifier 41 is connected to a pair of bit lines BL_SA(n) and /BL_SA(n). The first and second sense amplifiers 40 and 41 may have the same structure or configuration. Preferably, the second sense amplifier 41 has a lower performance as compared with a conventional sense amplifier.

The second controller 23 includes the above described equalizer 24, a second inverter circuit INV12 and a third inverter circuit INV13, which inverts an output of the INV12. The second inverter circuit INV12 is supplied with a sense amplifier driving signal ISA_EN. An output terminal of the second inverter circuit INV12 is connected to a gate of the third transistor NMOS14. An output terminal of the second inverter circuit INV12 is connected to an input terminal of the third inverter INV13. An output terminal of the third inverter circuit INV13 is connected to a gate of the fourth transistor PMOS14.

In the sense amplifier control circuit 23, when the sense amplifier driving signal /SA_EN is entered, sense amplifier driving signals SA_EN_N and SA_EN_P are outputted.

The operation in response to an equalizing signal EQS is the same as the conventional circuit shown in FIG. 1.

The first sense amplifier 40 and second sense amplifier 41 are arranged for each pair of bit lines. The first sense amplifier 40 operates in the same manner as the first preferred embodiment. The second sense amplifier 41 operates in the same manner as the conventional sense amplifier, although the performance thereof is lower than the conventional one.

According to the above-described first preferred embodiment, in writing operation, all of the sense amplifiers SA(0–n) are disabled. Therefore, in writing operation, all the pairs of bit lines BL_SA(0–n) and /BL SA(0–n) get in a floating condition. A node in a pair of target bit lines BL_SA(j) and /BL_SA(j), where "j" is one of 0 to n, is reversed in level. At this time, adjacent pairs of bit lines BL_SA(j+1) and /BL_SA(j+1); and BL_SA(j−1) and /BL_SA(j−1) are changed in level due to coupling effect.

On the other hand, according to the second preferred embodiment, in writing operation, the second sense amplifier is disabled, so that a pair of bit lines BL_SA(n) and /BL_SA(n) does not get in a floating condition. Therefore, level variation due to coupling effect between a pair of bit lines BL_SA(n) and /BL_SA(n) can be avoided. According to the second preferred embodiment, even in writing operation of reversed data, nodes of a pair of bit lines BL_SA and /BL_SA can be reversed at a high speed.

Further, according to the second preferred embodiment, capacities of the first and second sense amplifiers 40 and 41 are combined, so that the total performance or capacity is increased. As a result, sensing speed of a memory cell can be improved when data stored in the memory cell are sensed.

Third Preferred Embodiment

Figure 5:
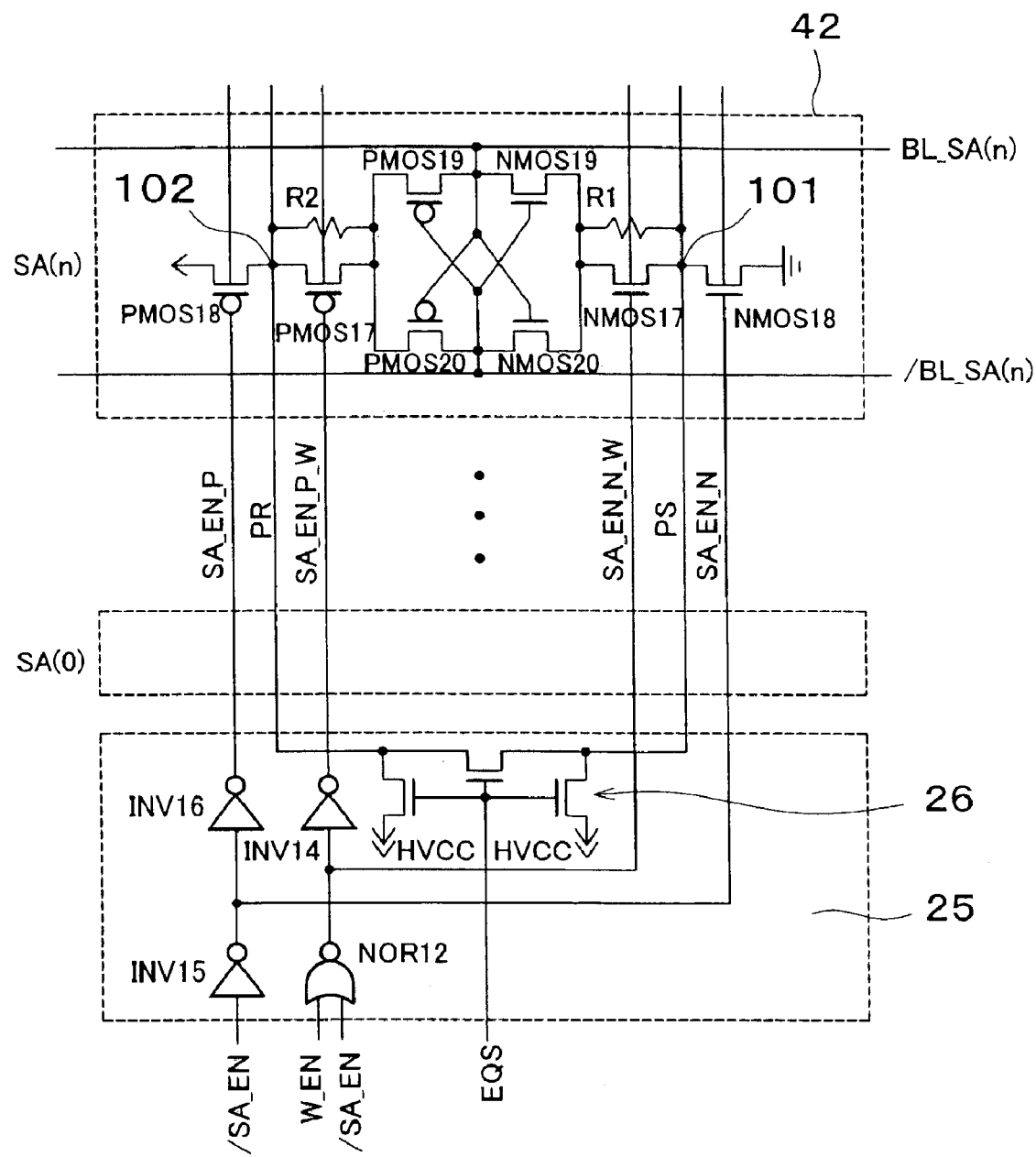
FIG. 5 is a circuit diagram illustrating a semiconductor memory device according to a third preferred embodiment of the present invention.

FIG. 5 is a circuit diagram showing a part of a semiconductor memory device according to a third preferred embodiment of the present invention. In this embodiment, the same structures and functions as those in the first and second preferred embodiments, shown in FIGS. 3 and 4, is not described again. The semiconductor memory device includes a third sense amplifier 42, connected between a pair of bit lines BL_SA(n) and /BL_SA(n), and a third sense amplifier controller 25.

The third sense amplifier 42 includes a flip-flop circuit, a fifth transistor NMOS17, a sixth PMOS17, a seventh transistor NMOS18, an eighth transistor PMOS18, a first resistance R1 and second resistance R2. The flip-flop circuit includes four MOS transistors PMOS19, PMOS20, NMOS19 and NMOS20. Sources of the PMOS19 and PMOS20 are connected to each other. Sources of the NMOS19 and NMOS20 are connected to each other.

The fifth transistor NMOS17 and seventh transistor NMOS18 are serially connected between a source terminal of the NMOS transistors in the flip-flop circuit and a ground terminal GND. A source of the fifth transistor NMOS17 and a drain of the seventh transistor NMOS18 are connected at a first node 101 in common. The fifth transistor NMOS17 is connected at a source terminal of the NMOS transistors of the flip-flop circuit.

The sixth transistor PMOS17 and eighth transistor PMOS18 are serially connected between a source terminal of the PMOS transistors in the flip-flop circuit and a power supply terminal VDD. A drain of the sixth transistor PMOS17 and a source of the eighth transistor PMOS18 are connected at a second node 102 in common. The sixth transistor PMOS17 is connected at a source terminal of the PMOS transistors of the flip-flop circuit.

The first resistance R1 is connected between a drain and a source of the fifth transistor NMOS17 in parallel. The second resistance R2 is connected between a drain and a source of the sixth transistor PMOS17 in parallel. The first and second nodes 101 and 102 are connected via PS and PR to the equalizer 26 in the third controller 25.

The third controller 25 includes the above described equalizer 26, a second NOR circuit NOR12, a fourth inverter circuit INV14, which inverts an output of the second NOR circuit NOR12, a fifth inverter circuit INV15, and a sixth inverter circuit INV16, which inverts an output of the fifth inverter circuit INV15.

The second NOR circuit NOR12 is supplied with an external write command signal W_EN and a sense amplifier driving signal /SA_EN. An output terminal of the second NOR circuit NOR12 is connected to a gate of the fifth transistor NMOS17 and an input terminal of the fourth inverter circuit INV14. An output terminal of the fourth inverter circuit INV14 is connected to a gate of the sixth transistor PMOS17.

The fifth inverter circuit INV15 is supplied with a sense amplifier driving signal /SA_EN. An output terminal of the fifth inverter circuit INV15 is connected to a gate of the seventh transistor NMOS18 and to an input terminal of the sixth inverter circuit INV16. An output terminal of the sixth inverter circuit INV16 is connected to a gate of the eighth transistor PMOS18.

In the sense amplifier control circuit 25, when the write command signal W_EN and sense amplifier driving signal /SA_EN are entered, sense amplifier driving signals SA_EN_N_W, SA_EN_P_W, SA_EN_N and SA_EN_P are outputted. The operation in response to an equalizing signal EQS is the same as the conventional circuit shown in FIG. 1.

According to this embodiment, in a sensing operation of data stored in the memory cell, all of the fifth to eighth transistors NMOS17, NMOS18, PMOS17 and PMOS18 are turned on. As a result, the sense amplifier 42 operates in the same manner as the conventional circuit. In writing operation, both of the fifth and sixth transistors NMOS17 and PMOS17 are turned off. Electrical current is supplied to the sense amplifier 42 through the first and second resistances R1 and R2. Therefore, performance or capability of the sense amplifier 42 is decreased.

According to this embodiment, in writing operation, nodes of a pair of bit lines BL_SA and /BL_SA can be reversed at a high speed. The second sense amplifier 41 and the second controller 23, used in the second preferred embodiment, can be replaced by the sense amplifier 42 and the controller 25, used in the third preferred embodiment.

Fourth Preferred Embodiment

Figure 6:
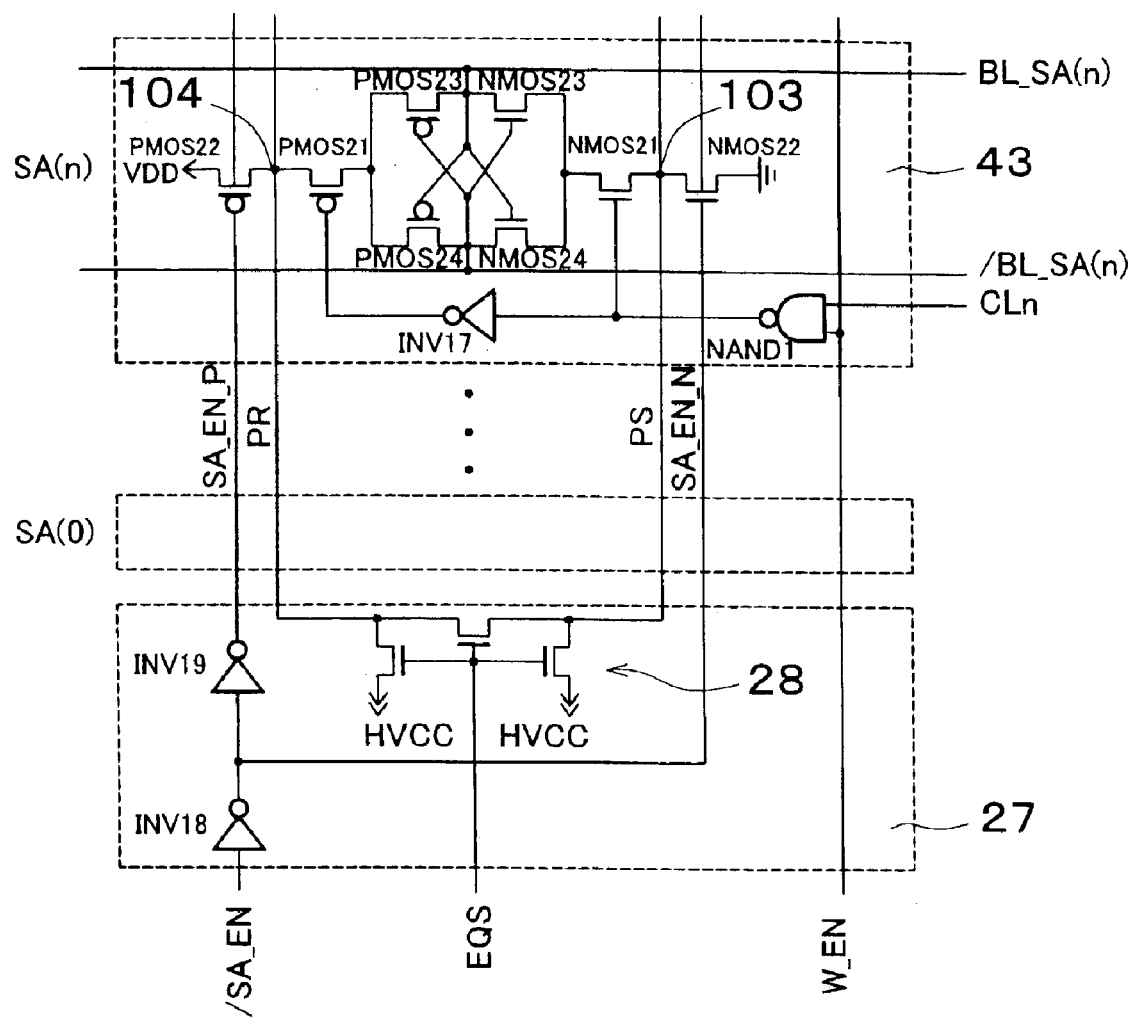
FIG. 6 is a circuit diagram illustrating a semiconductor memory device according to a fourth preferred embodiment of the present invention.

FIG. 6 is a circuit diagram showing a part of a semiconductor memory device according to a fourth preferred embodiment of the present invention. In this embodiment, the same structures and functions as those in the first to third preferred embodiments, shown in FIGS. 3–5, is not described again. The semiconductor memory device includes a fourth sense amplifier 43, connected between a pair of bit lines BL_SA(n) and /BL_SA(n), and a fourth controller 27, which controls the fourth sense amplifier 43.

The fourth sense amplifier 43 includes a flip-flop circuit, a ninth transistor NMOS21, a tenth PMOS21, an eleventh transistor NMOS22, a twelfth transistor PMOS22, a NAND circuit NAND1 and a seventh inverter circuit INV17. The flip-flop circuit includes four MOS transistors PMOS23, PMOS24, NMOS23 and NMOS24. Sources of the NMOS transistors NMOS23 and NMOS24 are connected to each other, and sources of the PMOS transistors PMOS23 and PMOS24 are connected to each other.

The ninth transistor NMOS21 and the eleventh transistor NMOS22 are serially connected between a ground terminal GND and a common source terminal of the NMOS23 and NMOS 24. A drain of the ninth transistor NMOS21 and a source of the eleventh transistor NMOS22 are connected in common at a third node 103. The ninth transistor NMOS21 is connected to a common source terminal of the NMOS23 and NMOS24. The tenth and twelfth transistors PMOS21 and PMOS22 are connected in series between a power supply terminal VDD and a common source terminal of the PMOS23 and PMOS24. The tenth transistor PMOS21 is connected to a common source terminal of the PMOS23 and PMOS24.

The NAND circuit NAND1 is supplied with a write command signal and a column line signal. An output terminal of the NAND1 is connected to a gate of the ninth transistor NMOS21 and an input terminal of the inverter INV17. An output terminal of the inverter INV17 is connected to a gate of the tenth transistor PMOS21. The node 103 and a node 104 are connected to an equalizer 28 arranged in the controller 27.

The fourth controller 27 includes the above described equalizer 28, an eighth inverter INV18 and a ninth inverter INV19, which inverts an output of the eighth inverter INV18.

The eighth inverter INV18 is supplied with a sense amplifier driving signal /SA_EN. An output terminal of the eighth inverter INV18 is connected to a gate of the eleventh transistor NMOS22 and to an input terminal of the ninth inverter INV19. An output terminal of the ninth inverter INV19 is connected to a gate of the twelfth transistor PMOS22.

In the sense amplifier control circuit 27, when a sense amplifier driving signal /SA_EN is entered, sense amplifier driving signals SA_EN_N and SA_EN_P are outputted. The operation in response to an equalizing signal EQS is the same as the conventional circuit shown in FIG. 1.

According to this embodiment, in writing operation, a signal W_EN is turned low "L" to high "H", and a selected column line is turned low "L" to high "H" in level. An output signal of the NAND circuit NAND1 is turned high "H" to low "L" in level, and an output signal of the seventh inverter INV17 is turned low "L" to high "H". As a result, the ninth and tenth transistors NMOS21 and PMOS21 are turned off, so that only the sense amplifier SA(n) is disabled.

As described above, according to this embodiment, a sense amplifier SA(n) of writing target is only disabled in writing operation. Therefore, nodes of a pair of bit lines BL_SA and /BL_SA can be reversed at a high speed. The other sense amplifiers are maintained being enable, so that coupling noise is reduced. The second sense amplifier 41 and the second controller 23, used in the second preferred embodiment, can be replaced by the sense amplifier 43 and the controller 27, used in the fourth preferred embodiment.

Fifth Preferred Embodiment

Figure 7:
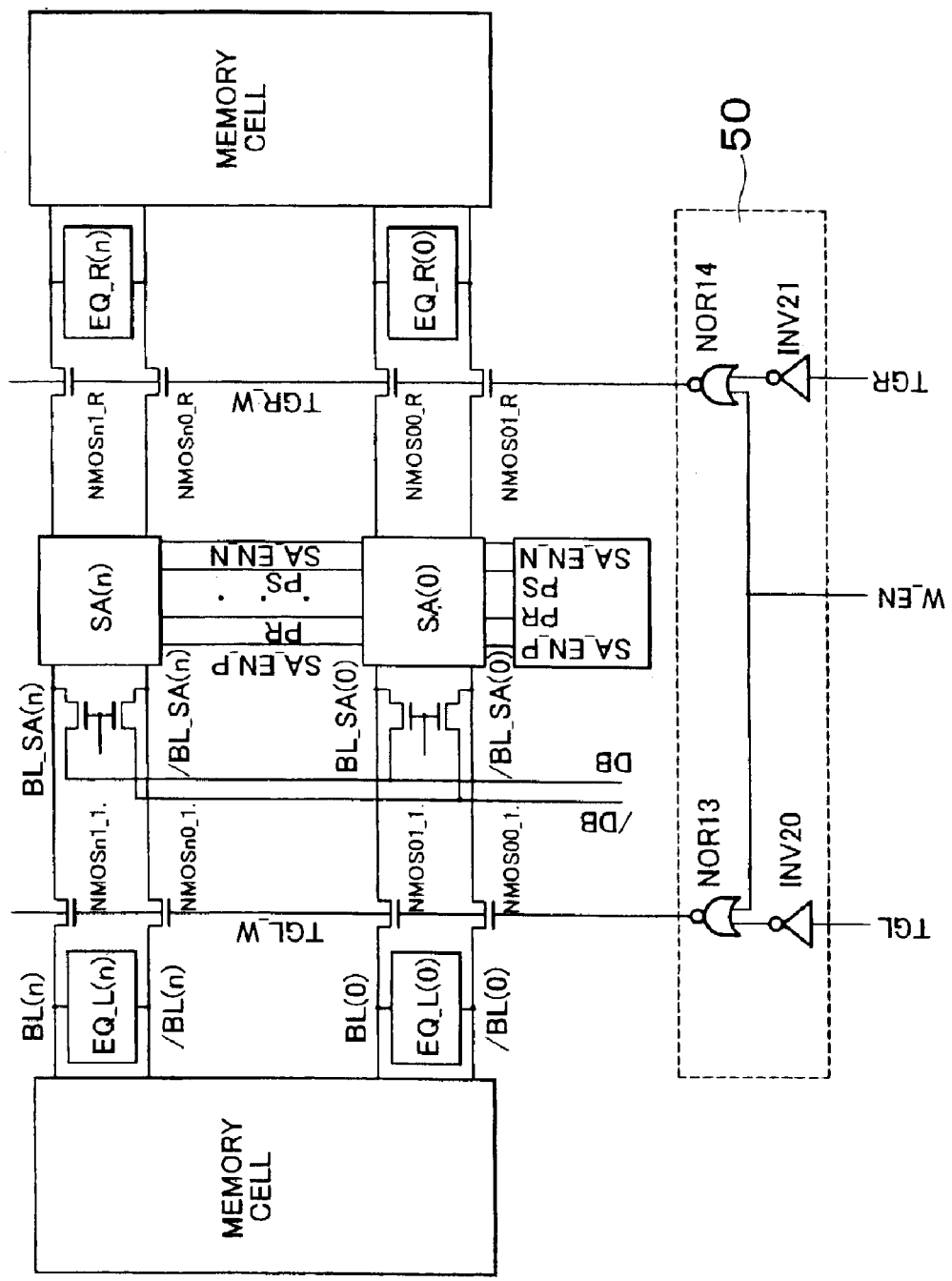
FIG. 7 is a circuit diagram illustrating a semiconductor memory device according to a fifth preferred embodiment of the present invention.

FIG. 7 is a circuit diagram showing a part of a semiconductor memory device according to a fifth preferred embodiment of the present invention. In this embodiment, the same structures and functions as those in the first to fourth preferred embodiments, shown in FIGS. 3–6, is not described again.

The semiconductor memory device includes a TG control circuit 50, which controls a transmission signal. On a pair of bit lines BL_SA(n) and /BL_SA(n), connected to a sense amplifier SA(n), switching transistors NMOSn1_1, NMOSn0_1, NMOSn1_R and NMOSn0_R are connected between the sense amplifier SA(n) and a memory cell array. Gates of those transistors NMOSn1_1 NMOSn0_1, NMOSn1_R and NMOSn0_R are connected to transmission lines TGL_W and TGR_W.

The TG control circuit 50 includes a pair of NOR circuits NOR13 and NOR14, a pair of inverter circuits INV20 and INV21. The NOR circuit NOR13 is supplied with a write command signal W_EN and an output signal of the inverter INV20. The NOR circuit NOR14 is supplied with a write command signal W_EN and an output signal of the inverter INV21. Output terminals of the NOR circuit NOR13 and NOR14 are connected to gates of the transistors NMOSn1_1 and NMOSn1_R through the transmission lines TGL_W and TGR_W, respectively.

The transistors NMOSn1_1 and NMOSn0_1 form a pair. The transistors NMOSn1_r and NMOSn0_r form another pair. The transistors NMOSn1–1 and NMOSn1_r are arranged on the bit line BL_SA(n) at the opposite sides of the sense amplifier SA(n). The transistors NMOSn0_1 and NMOSn0_R are arranged on the bit line /BL_SA(n) at the opposite sides of the sense amplifier SA(n).

In writing operation, when a write command signal W_EN is turned low "L" to high "H", transmission signals TGL_W and TGR_W are turned to low "L". As a result, all the switching transistors NMOSn1_1, NMOSn0_1, NMOSn1_R and NMOSn0_R are turned off.

The transmission signal TGL_W is turned to low "L" in writing operation, so that load to the bit lines BL and /BL are removed. As a result, nodes of a pair of bit lines BL_SA and /BL_SA can be reversed at a high speed.

Sixth Preferred Embodiment

Figure 8:
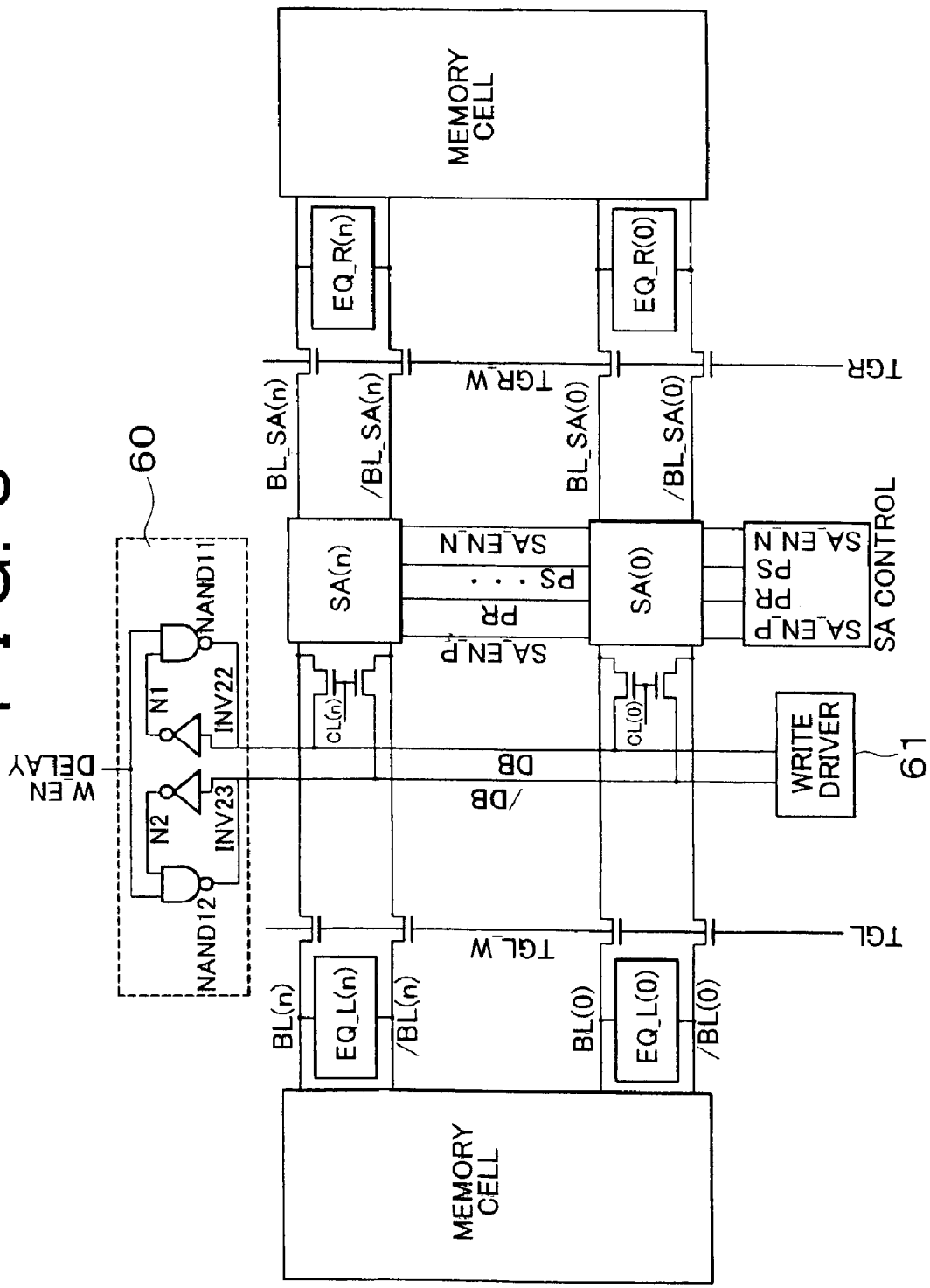
FIG. 8 is a circuit diagram illustrating a semiconductor memory device according to a sixth preferred embodiment of the present invention.

FIG. 8 is a circuit diagram showing a part of a semiconductor memory device according to a sixth preferred embodiment of the present invention. In this embodiment, the same structures and functions as those in the first to fifth preferred embodiments, shown in FIGS. 3–7, is not described again.

A major feature of this embodiment, the semiconductor memory device includes a latch circuit 60. The latch circuit 60 is connected at ends of a pair of data lines DB and /DB. The other ends of the data lines DB and /DB are connected to a write driver circuit 61.

The latch circuit 60 includes inverter circuits INV22 and INV23, NAND circuits NAND11 and NAND12. The inverter circuits INV22 and INV23 are supplied with data signals through the data lines DB and /DB, respectively. Input terminals of the NAND 11 are supplied with a delayed write command signal W_EN_DELAY and an output signal N1 of the inverter circuit INV22. Input terminals of the NAND 12 are supplied with the delayed write command signal W_EN_DELAY and an output signal N2 of the inverter circuit INV23. Output terminals of the NAND circuits NAND11 and NAND12 are connected to the data lines DB, and /DB, respectively.

In writing operation, a write command signal W_EN is turned low "L" to high "H", and the delayed write command signal W_EN_DELAY is turned low "L" to high "H". In response to writing data, output levels of the inverter circuits INV22 and INV23 are defined. After the output levels of the inverter circuits INV22 and INV23 and the delayed write command signal W_EN_DELAY are determined, output levels of the NAND circuits NAND11 and NAND12 are shifted or changed to a value of the write driver circuit 61. As a result, writing data at the data lines DB and /DB are driven at the both ends of the data lines DB and /DB.

A wiring resistance of the data lines DB and /DB, connected between a sense amplifier SA and the write driver circuit 61 can be decreased. As a result, nodes of a pair of bit lines BL_SA and /BL_SA can be, reversed at a high speed.

What is claimed is:

1. A semiconductor memory device, comprising:
   a pair of bit lines;
   a first sense amplifier coupled to the pair of bit lines, wherein the first sense amplifier comprises a flip-flop circuit having a pair of NMOS transistors and a pair of PMOS transistors; a first transistor connected to source terminals of the NMOS transistors in the flip-flop circuit; and a second transistor connected to source terminals of the PMOS transistors in the flip-flop circuit;
   a first controller, which controls the first sense amplifier wherein the first controller comprises a first NOR circuit having input terminals to which a write command signal and a sense amplifier driving signal are supplied and having an output terminal connected to a gate of the first transistor; and
   an equalizer connected to the source terminals of the NMOS and PMOS transistors.

2. A semiconductor memory device according to claim 1, further comprising:
   a second sense amplifier coupled to the pair of bit lines; and a second controller which controls the second amplifier,
   wherein the second sense amplifier comprises a second flip-flop circuit having a pair of second NMOS transistors and a pair of second PMOS transistors; a third transistor connected to source terminals of the second NMOS transistors in the second flip-flop circuit; and a fourth transistor connected to source terminals of the second PMOS transistors in the second flip-flop circuit;
   the second controller comprising
   a first inverter to which the sense amplifier driving signal is supplied, an output terminal of the first inverter being connected to a gate of the third transistor; and
   a second inverter which inverts an output signal of the first inverter, an output terminal of the second inverter being connected to a gate of the fourth transistor.

3. A semiconductor memory device according to claim 2, further comprising:
   a second equalizer which is connected to the source terminals of the second NMOS transistors and the second PMOS transistors.

4. A semiconductor memory device according to claim 2, wherein the first and second sense amplifiers are connected to different pairs of bit lines.

5. A semiconductor memory device according to claim 2, wherein the second sense amplifier has a lower performance as compared with the first sense amplifier.

6. A semiconductor memory device according to claim 1, further comprising:
   a second sense amplifier coupled to the pair of bit lines; and
   a second controller that controls the second sense amplifier,
   wherein the second sense amplifier comprises
   a second flip-flop circuit having a pair of second PMOS transistors and a pair of second NMOS transistors,
   third to sixth transistors,
   a first resistance connected in parallel between a source and a drain of the third transistor, and
   a second resistance connected in parallel between a source and a drain of the fourth transistor,
   wherein a source of the third transistor and a drain of the fifth transistor are connected together at a first node, and a drain of the third transistor is connected to source terminals of the second NMOS transistors in the second flip-flop circuit, and
   wherein the drain of the fourth transistor and a source of the sixth transistor are connected together at a second node, and a source of the fourth transistor is connected to source terminals of the second PMOS transistors in the second flip-flop circuit, and wherein the second controller comprises
   a second NOR circuit, to which the write command and the sense amplifier driving signal are supplied, an output terminal of the second NOR circuit being connected to a gate of the third transistor,
   a first inverter, which inverts an output of the second NOR circuit, an output terminal of the first inverter being connected to a gate of the fourth transistor,
   a second inverter, to which the sense amplifier driving signal is supplied, an output terminal of the second inverter being connected to a gate of the fifth transistor, and
   a third inverter, which inverts an output of the second inverter, an output terminal of the third inverter being connected to a gate of the sixth transistor.

7. A semiconductor memory device according to claim 1, further comprising:
   a second sense amplifier coupled to the pair of bit lines; and
   a second controller that controls the second sense amplifier,
   wherein the second sense amplifier comprises a second flip-flop circuit having a pair of second PMOS transistors and a pair of second NMOS transistors,
third to sixth transistors,
a NAND circuit to which the write command signal and a column line signal are input,
a first inverter having an output terminal connected to a gate of the fourth transistor and that inverts an output of the NAND circuit,
wherein a drain of the third transistor and a source of the fifth transistor are connected together at a first node, and a source of the third transistor is connected to source terminals of the second NMOS transistor in the second flip-flop circuit, and
wherein a drain of the fourth transistor and a source of the sixth transistor are connected together at a second node, and a source of the fourth transistor is connected to source terminals of the second PMOS transistors in the second flip-flop circuit, and wherein the second controller comprises
a second inverter, which inverts the sense amplifier driving signal, an output terminal of the second inverter being connected to a gate of the third transistor, and
a third inverter, which inverts an output of the second inverter, an output terminal of the third inverter being connected to a gate of the sixth transistor.

8. A semiconductor memory device, comprising:
a pair of bit lines;
a first sense amplifier which is coupled to a pair of bit lines; and
a first controller, which controls the first sense amplifier,
wherein the first sense amplifier comprises
a flip-flop circuit having a pair of PMOS transistors and a pair of NMOS transistors,
first to fourth transistors,
a first resistance connected in parallel between a source and a drain of the first transistor, and
a second resistance connected in parallel between a source and a drain of the second transistor,
wherein the source of the first transistor and a drain of the third transistor are connected together at a first node, and the drain of the first transistor is connected to source terminals of the NMOS transistor in the flip-flop circuit, and
wherein the drain of the second transistor and a source of the fourth transistor are connected together at a second node, and a source of the second transistor is connected to source terminals of the PMOS transistors in the flip-flop circuit, and wherein the first controller comprises;
a first NOR circuit, to which a write command and a sense amplifier driving signal are supplied, an output terminal of the first NOR circuit being connected to a gate of the first transistor,
a first inverter, which inverts an output of the first NOR circuit, an output terminal of the first inverter being connected to a gate of the second transistor,
a second inverter, to which the sense amplifier driving signal is supplied, an output terminal of the second inverter being connected to a gate of the third transistor, and
a third inverter, which inverts an output of the second inverter, an output terminal of the third inverter being connected to a gate of the fourth transistor.

9. A semiconductor memory device according to claim 8, further comprising:
an equalizer connected to the first and second nodes.

10. A semiconductor memory device, comprising:
a pair of bit lines;
a first sense amplifier which is coupled to the pair of bit lines; and
a first controller, which controls the first sense amplifier,
wherein the first sense amplifier comprises
a flip-flop circuit having a pair of PMOS transistors and a pair of NMOS transistors,
first fourth transistors,
a NAND circuit to which a write command signal and a column line signal are input, and
a first inverter having an output terminal connected to a gate of the second transistor and that inverts an output of the NAND circuit,
wherein a drain of the first transistor and a source of the third transistor are connected together at a first node, and a source of the first transistor is connected to source terminals of the NMOS transistors in the flip-flop circuit, and
wherein a drain of the second transistor and a source of the fourth transistor are connected together at a second node, and a source of the second transistor is connected to source terminals of the PMOS transistors in the flip-flop circuit, and
wherein the fourth controller comprises
a second inverter, which inverts a sense amplifier driving signal, an output terminal of the second inverter being connected to a gate of the third transistor, and
a third inverter, which inverts an output of the second inverter, an output terminal of the third inverter being connected to a gate of the fourth transistor.

11. A semiconductor memory device according to claim 10, further comprising:
an equalizer connected to the first and second nodes.

12. A semiconductor memory device, comprising:
a memory cell array;
a pair of bit lines coupled to the memory cell array;
a sense amplifier which is coupled to the pair of bit lines;
switching transistors which are connected between the sense amplifier and the memory cell array; and
a transmission control circuit, which supplies a transmission signal to the switching transistors, causing the switching transistors to be turned off during a writing operation.

13. A semiconductor memory device according to claim 12, wherein the transmission control circuit comprises a NOR circuit having input terminals to which a write command signal and a transmission signal are supplied, and an output terminal connected to gates of the switching transistors.

14. A semiconductor memory device according to claim 12, wherein
a pair of the switching transistors are serially coupled to each of the bit lines, one of the switching transistors coupled to a bit line being arranged at one side of a corresponding sense amplifier and another of the transistors coupled to the bit line being arranged at another side of the corresponding sense amplifier,
the transmission control circuit comprises a first NOR circuit an output of which is coupled to gates of the switching transistors at the one side of the sense amplifiers, and a second NOR circuit an output of which is coupled to gates of the switching transistors at the another side of the sense amplifiers.

15. A semiconductor memory device, comprising:
a memory cell array;
a pair of bit lines coupled to the memory cell array;
a sense amplifier which is coupled to the pair of bit lines;
a pair of data lines;
a pair of switching transistors respectively coupled between the data lines and the bit lines;
a data driver which supplies data to the data lines; and
a latch circuit coupled to the data lines,
wherein the latch circuit comprises
- a first inverter having an input terminal connected to one of the data lines,
- a second inverter having an input terminal connected to another of the data lines,
- a first NAND circuit having input terminals to which a delayed write command signal and an output signal of the first inverter are supplied, and having an output terminal coupled to the one of the data lines, and
- a second NAND circuit having input terminals to which the delayed write command signal and an output signal of the second inverter are supplied, and having an output terminal coupled to the another of the data lines.

* * * * *